United States Patent [19]
Leiter et al.

[11] Patent Number: 6,001,176
[45] Date of Patent: Dec. 14, 1999

[54] METHOD AND DEVICE FOR SPECIFIC FORMATION OF NUCLEI OR CRYSTALS

[75] Inventors: Klaus Leiter, Innsbruckerstrasse 40, A-6176 Völs; Gerhard Walder, Rengasse 25, A-6020 Innsbruck, both of Austria

[73] Assignees: Klaus Leiter; Gerhard Walder, both of Austria

[21] Appl. No.: 08/718,328

[22] PCT Filed: Apr. 4, 1995

[86] PCT No.: PCT/AT95/00067

§ 371 Date: Oct. 4, 1996

§ 102(e) Date: Oct. 4, 1996

[87] PCT Pub. No.: WO95/26931

PCT Pub. Date: Oct. 12, 1995

[30] Foreign Application Priority Data

Apr. 5, 1994 [AT] Austria ........................................ 698/94

[51] Int. Cl.⁶ ...................................................... C30B 7/12
[52] U.S. Cl. ................................ 117/206; 117/68; 117/70; 117/925; 117/926; 117/927; 204/290 R; 204/291
[58] Field of Search .................. 204/290 R, 291; 117/925, 926, 927, 68, 70, 206

[56] References Cited

U.S. PATENT DOCUMENTS 4,529,488 7/1985 Kotani et al. .
4,822,473 4/1989 Arnesen .
5,071,532 12/1991 Taillet et al. ............................. 204/228
5,214,300 5/1993 Rohrer et al. ........................... 257/295
5,681,457 10/1997 Mahoney ............................. 210/198.1
5,759,923 6/1998 McMillan et al. ...................... 438/788

FOREIGN PATENT DOCUMENTS 0376835 7/1990 European Pat. Off. .
646882 11/1950 United Kingdom .
8604321 7/1986 WIPO .
8704422 7/1987 WIPO .

OTHER PUBLICATIONS

Abstract of JP Application 4–367598 filed by Sumitomo Electric Ind. Ltd. on Jun. 14, 1991, English language abstract provided by Japanese Patent Office, Unexamined Applications May 13, 1993, p. 99C1057.

"Molecular Recognition in Biomineralization" by Stephen Mann in *Nature*, vol. 332 Oct. 3, 1968, pp. 119 ff; and *Biomineralization*, S. Mann, J. Webb and R.J.P. Williams, CH Public 1989, pp. 35 ff.

Journal of Physics D: Applied Physics, vol. 24, No. 2 Feb. 14, 1991, Letchworth GB, pp. 154–164; Mann et al. "Structural and stereochemical relationships between Langmuir monolayers and calcium carbonate nucleation."

*Primary Examiner*—Robert Kunemund
*Attorney, Agent, or Firm*—Lorusso & Loud

[57] ABSTRACT

A device for specific formation of nuclei or crystals on the surface of a dielectric in contact with a solution, especially on the functional groups of a polymer, in which there is a device for generating an electric field in the dielectric.

36 Claims, 5 Drawing Sheets

METHOD AND DEVICE FOR SPECIFIC FORMATION OF NUCLEI OR CRYSTALS

The invention relates to a device for specific formation of nuclei or crystals on the surface of a dielectric in contact with a solution, in particular on the functional groups of a polymer.

The invention further relates to a method for controlling the formation of nuclei or the epitaxial growth of crystals from a solution on a surface of a dielectric, in particular on the functional groups of a polymer.

It is already known that crystal nuclei are formed or epitaxial growth of a mineral phase takes place on dielectric surfaces, wherein the chemical, morphological and sterochemical properties of the surface influence this growth. Such formation of nuclei takes place, for example, in nature, where biopolymers induce and control the growth of shells, skeletons, teeth or the like. The biomineralization is described, for example, in the article "Molecular recognition in biomineralization" by Stephen Mann in *Nature*, Vol. 332, 10.31988, pages 119 ff, or in the book "Biomineralization" by S. Mann, J. Webb and R. J. P. Williams, *CH Publications* 1989, pages 35 ff.

Technical applications have as yet remained limited to specially produced macromolecules which, having certain functional surface groups, are able to control precipitation and flocculation reactions (for example, tensides, phosphates); for this, these compounds must, for the most part, be mixed directly with the solution—the control of the reactions is, however, possible only by means of the amount added or by means of addition of certain chemicals which cause certain charge reversal in the polymers.

SUMMARY OF INVENTION

The object of the invention is to provide a device and a method of the type described in the introduction, upon which crystal nuclei or crystals with a defined form, size, structure and orientation can be grown in a specific and controlled manner.

According to the invention this is achieved in a device of the type described in the introduction by a means for generating an electric field in the dielectric.

Polarisation or an increase in the polarisation already present in the dielectric is obtained with the electric field, in particular, the orientation of functional groups (for example carboxylate groups, carbonyl groups or amino groups for the synthesis of $CaCO_3$, $CaPO_4$) away from the contact surface of the dielectric towards the solution is also obtained. As a result, a so-called electric double layer is formed. Normally, homogeneous formation of nuclei occurs only when critical supersaturation is reached in the solution. Such critical supersaturation can be obtained locally in the dielectric double layer in that an electric field is created by means of the potential on the field generating electrodes, which changes the proportion of the concentrations of ions in the solution within the double layer.

For example, with a negatively charged electrode the proportion of the concentrations of $Ca^{2+}$ and $CO_3^{2-}$ can be changed in the double layer in favour of the Ca ions. The product of $[Ca^{2+}] \times [CO_3^{2-}]$, which has a certain value in the saturation (thermodynamic balance, regardless of pH value and temperature), is, when it is also taken into account that $Ca^{2+}$ Ions and $CO_3^{2-}$ bond with a different number of water molecules and are consequently differently protected (solvated), clearly exceeded in certain areas of the double layer—supersaturation is obtained locally and thereby the homogeneous formation of nuclei can be initiated.

Moreover, it is possible to control, by means of the electric field, a specific accumulation of the dissolved ions in the proximity of the functional groups and the specific involvement of the functional groups in the nucleus forming reaction. This consequently results in a formation of nuclei or crystal growth which can be influenced by means of the electric field. For example, different macromolecular compounds influence the formation of nuclei from mineral phases on their surface through the presence of certain functional groups such as, for example, the carboxylate group (—COO), the carbonyl group (—CO), the sulphonate group (—$SO_3^-$), the sulphate group (—$OSO_3^-$), the quaternary amino group (—$NR_3^+$, R=H or an organic group), different ester groups and so forth. These functional groups can contribute to the formation of nuclei in different ways:

by electrostatic accumulation (local supersaturation—homogeneous formation of nuclei)

by formation of ligands of the functional groups into cations from the solution (metal ions) and reduction of the activating energy of the formation of nuclei (heterogeneous formation of nuclei)

by means of the presence of a structural and sterochemical correspondence of the functional groups with a certain crystal structure, nuclei/crystals grow according to the pre-determined crystallographic structure on the functional groups (heterogeneous formation of nuclei)

by combination of the preceding effects

By means of the electric field applied according to the invention, the activity of such functional groups, their orientation and position on the surface can be specifically influenced.

By special selection of the chain lengths of the polymers, the functional groups can arrange themselves at a certain distance apart from one another; in this way it is possible to provide a stereospecific surface structure in order to allow crystal nuclei/crystals of a certain size, structure and crystallographic orientation to grow (fine adjustment of the distances can be obtained using an additional differently directed electric field or by mechanical stress—expansion, compression of the plastics).

Continuous and alternating fields, or superimpositions thereof are in principle suitable as electric fields. It is particularly advantageous when the amount and/or the direction and/or (with an alternating field) the frequency are controllable. In this way, the growth process of the nuclei or crystals can be specifically influenced. The typical preferred field strengths are typically between 0 V/m and $10^7$ V/m.

Further advantages and details of the invention will be explained with reference to the following brief description of the drawings.

Figure 6:
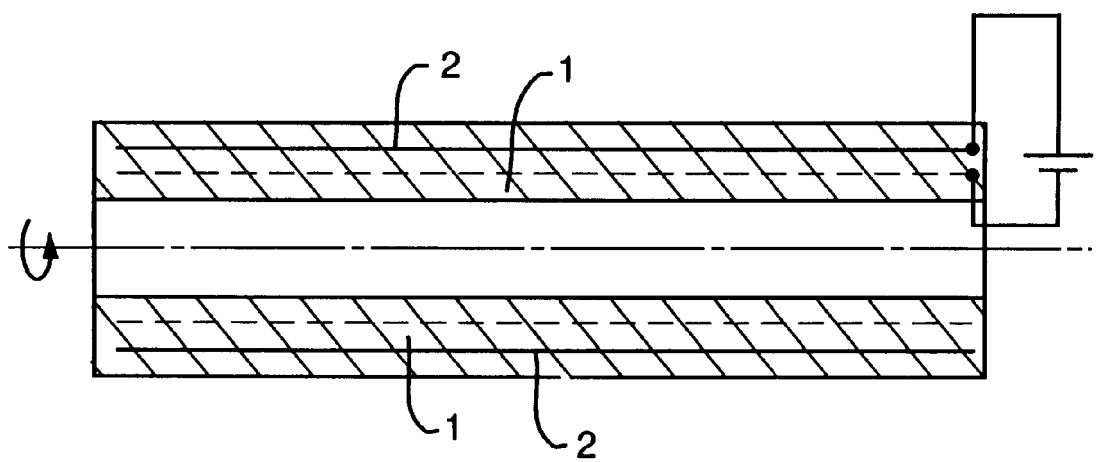

FIG. 6 also shows a cylindrical embodiment, wherein, however, the active surface of the dielectric which is exposed to the electric field faces the inside of a tube formed therefrom.

Figure 7:
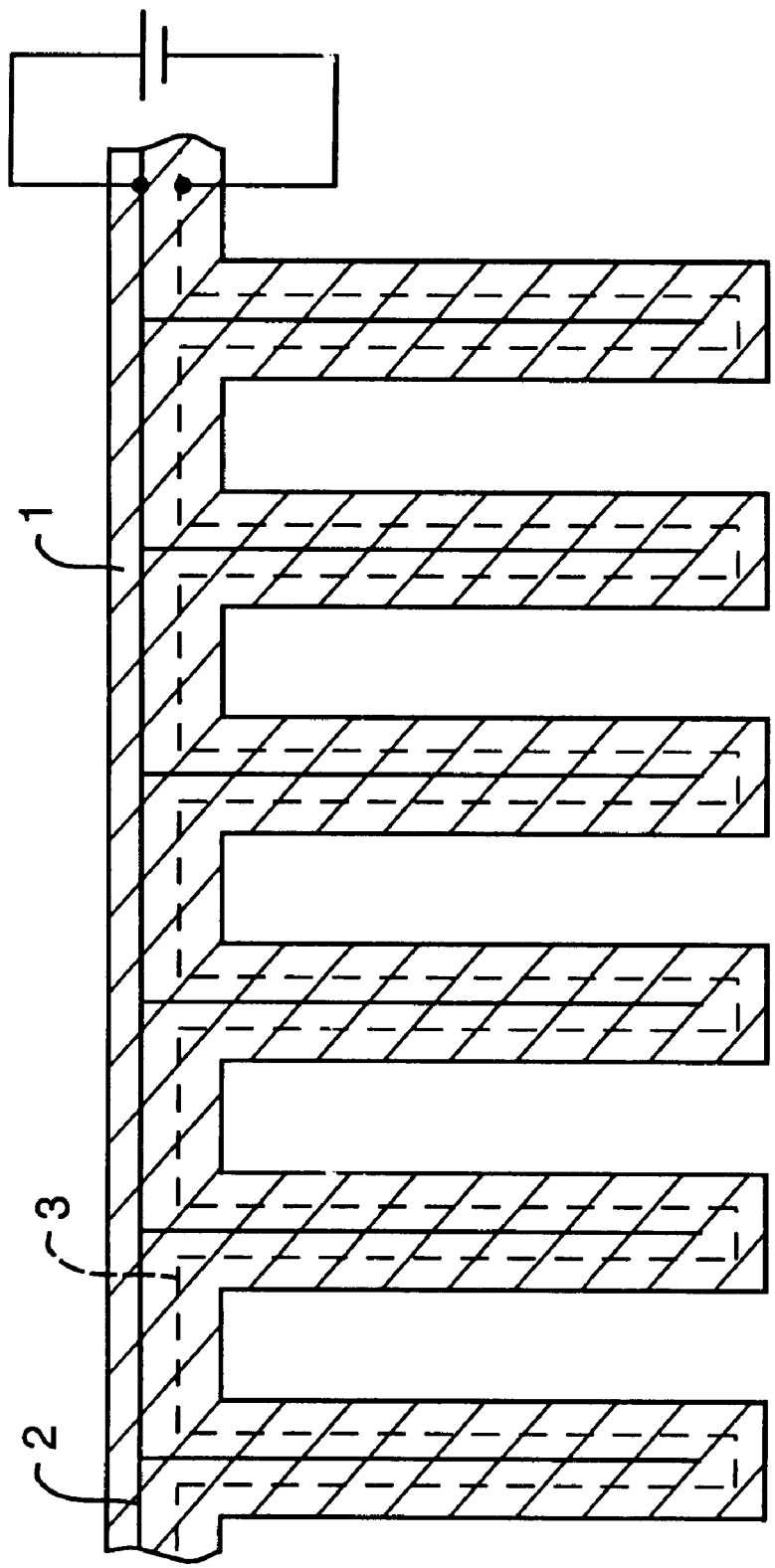

FIG. 7 shows an embodiment in the shape of a fish-trap.

Figure 8:
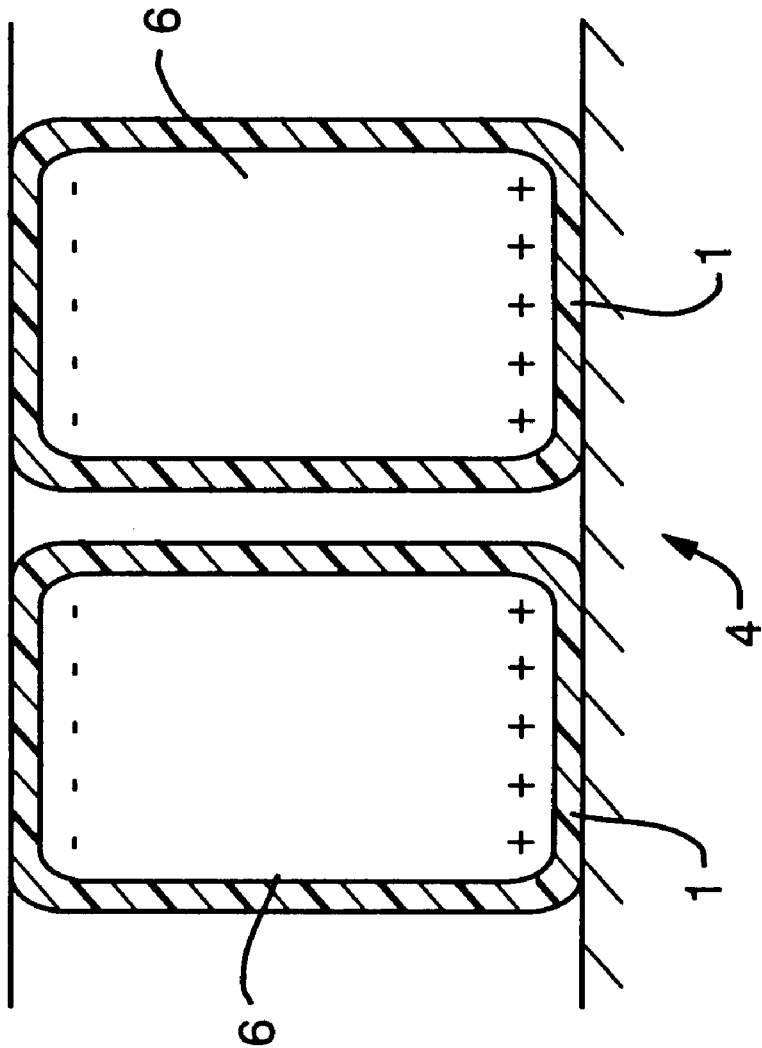

FIG. 8 shows an embodiment of generating an electric field.

DETAILED DESCRIPTION

Figure 1:
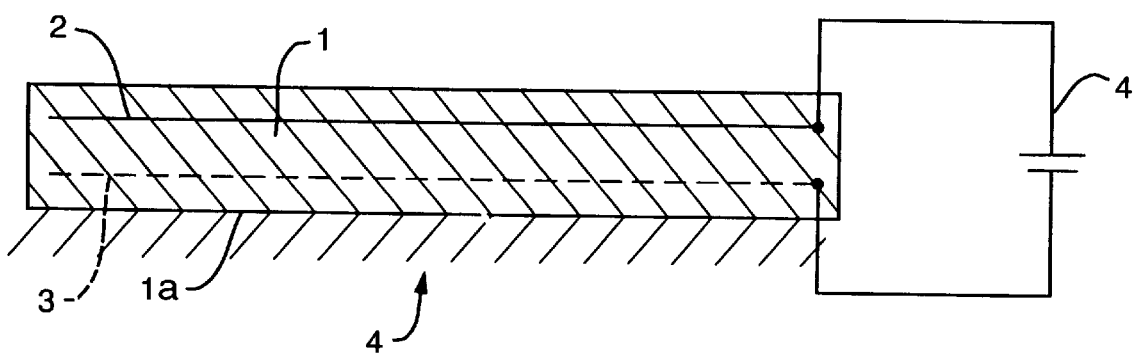
FIG. 1 shows schematically an embodiment of a device according to the invention with a dielectric with a planar surface.
Figure 2:
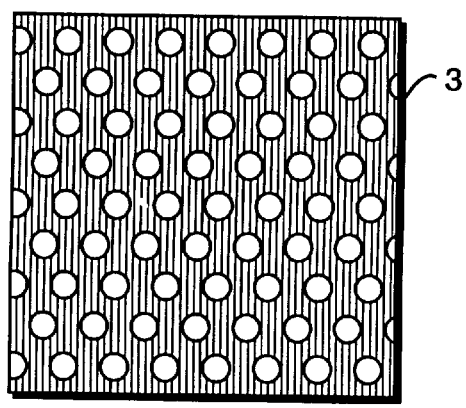
FIG. 2 shows a perforated electrode as can be used in FIG. 1.

The device shown in FIG. 1 is provided with a dielectric 1, for example a polyamide. Two electrodes 2, 3 are cast into the dielectric 1, which are supplied with a direct voltage from a voltage source 4. The electrode 3 is configured as a perforated electrode, as shown in FIG. 2. Consequently, there is field penetration through the holes in the perforated electrode 3, which causes polarisation on the active surface 1a of the dielectric. The active surface 1a of the dielectric is exposed to the solution 4 out of which the nuclei or crystals will grow on the surface. With the embodiment of the device according to the invention shown in FIGS. 1, 2, for example, a higher rate of calcuim deposition can be obtained on a polyamide surface from a calcium supersaturated aqueous solution 4.

Polyamides normally from unbranched chains with recurring carboxylic acid amide groups:

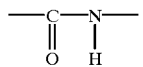

The molecule mass is between 15000 and 50000. Polyamides are first and foremost thermoplastic materials.

Polyamide 6 is used as the dielectric. The holes in the electrode 3 are circular and have a diameter of 5 mm. The respective polyamide layer is 1 mm thick.

By applying a potential difference of 0 V to 1000 V, the maximum amount of vertical components in the electric field on the surface of the dielectric can be varied from 0 V/m to approximately $2 \times 10^5$ V/m (linear).

By mixing aqueous solutions of $CaCl_2$ and $NaCO_3$/$NaHCO_3$, at a pH value of 10, supersaturated solutions can be defined over a wide range.

In an experiment to test performance, two identically constructed devices were used. One device was operated without application of a potential difference (reference). The second device is the actual device, operated with an electric field according to the invention.

Before each measurement, calcium layers present on the devices were removed in bath of 5% hydrochloric acid, then the devices were cleaned with twice-distilled water, dried in a desiccator and the dry weight determined using an analytical balance.

The device were immersed in the supersaturated solution and an appropriate potential difference was applied to one of the devices. After a certain time the devices were removed from the solution, dried in the desiccator and the dry weight determined with the analytical balance. The weight difference of the resulting dry weight minus the previous dry weight indicated the calcium deposited.

In different test runs it was shown that dependent upon the strength of the field applied, in the same period of time significantly more calcium was deposited on the device with the electric field than on the device (without a field).

These results show that a specific polarised surface is suitable for accelerating the formation of nuclei of calcium.

Polymers, crystals, ceramics, metal oxides or glasses are particularly suitable as dielectrics. Polymers are particularly advantageous, as by means of selection of suitable monomers they allow, in a simple manner, the construction of functional groups as actual centres of formation of crystal nuclei.

With a hard-setting dielectric, the electrodes can be coat in said dielectric, as shown in FIG. 1. However, it is also possible to at least partially vapour deposit the electrodes as conductive layers or to use conductivity lacquers or amalgam layers. In principle, electrolytes are also conceivable and possible as electrodes.

The dielectric and/or the electrodes generating the electric field can be produced by means of planar epitaxy (repro technique, mask technique, electron beam lithography). In this way it is possible to construct tiny structures on the surface and thereby to correspondingly influence the growth of crystals or nuclei. Fine adjustment, apart from a variation in the dielectric field according to the invention, is also possible using means for expanding or compressing the dielectric. This can be done by application of an appropriate force or by an increase or decrease in temperature.

In general, it is also of interest to limit the growth of the crystals or nuclei. Therefore, the invention advantageously provides that means for removing the nuclei or crystals formed on the dielectric are provided. These means can be used individually or together. One possibility is that the electric field is switched off or its poles are reversed using a control device. Removal is also possible by means of an ultrasound source. Lastly, the solution 4 can also be moved, that is to say a flow is caused which, because of the shearing forces along the surface, entrains sufficiently large crystals with it.

Figure 3:
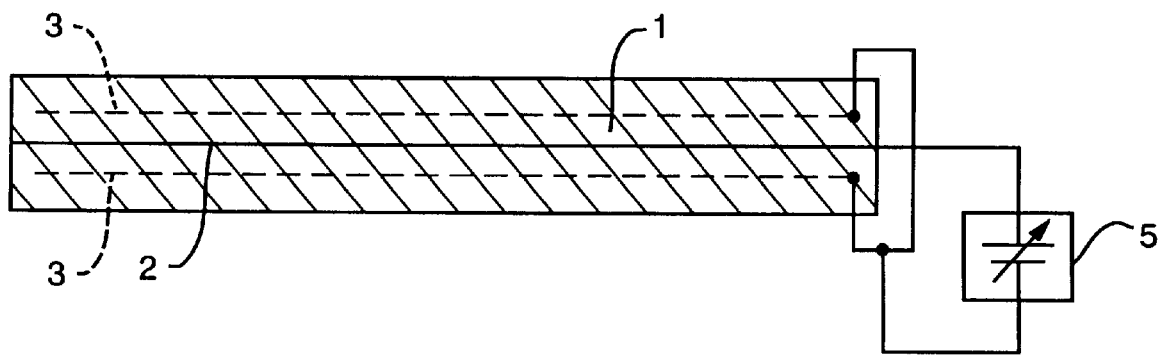
FIG. 3 shows a further embodiment in which the dielectric is provided on both sides with an active surface for formation of nuclei or formation of crystals.

In addition to the embodiment shown in FIGS. 1 and 2 and the variations already described, further variants are conceivable and possible. For example, FIG. 3 shows a variation in which perforated electrodes 3 are arranged on both sides of a central electrode, through which field penetration of the electric field takes place. The device shown in FIG. 3 thereby has two active planar surfaces. By means of a control means 5, the size of the potential applied, and with this the strength of the field, can be regulated. It would also be possible to apply different voltages to the upper and lower perforated electrodes.

Figure 4:
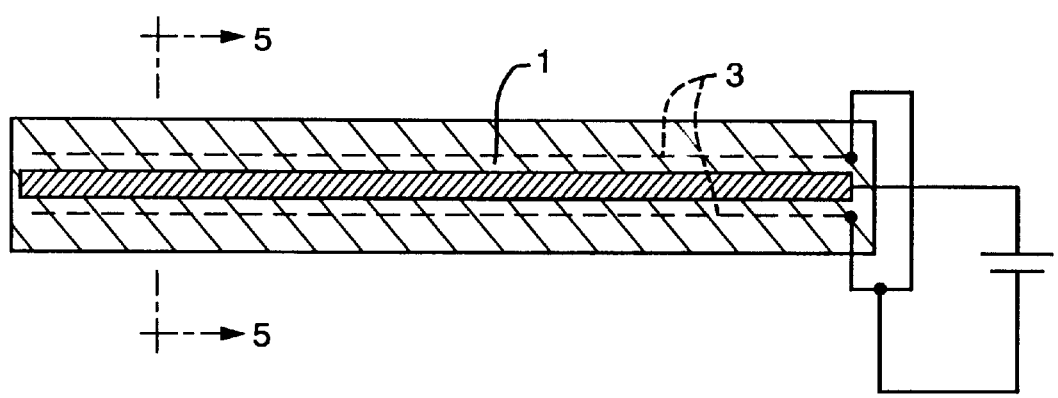
FIG. 4 shows an embodiment with a cylindrical surface.
Figure 5:
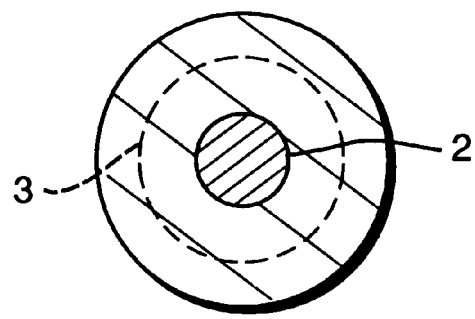
FIG. 5 shows a section according to the line A—A in FIG. 4.

The embodiment shown in FIG. 4 relates to a device with a cylindrical external surface. The perforated electrode is cylindrically curved and arranged about a central, middle electrode 2. FIG. 5 shows a corresponding cross-section.

FIG. 6 shows an embodiment in which the whole device is configured as a tube. A cylindrical external electrode 2 in the dielectric encloses a cylindrical internal electrode 3, which is also embedded in the dielectric. This internal electrode 3 is configured as a perforated electrode, so that the electric field reaches the cylindrical internal surface of the dielectric. FIG. 7 shows an embodiment in the shape of a fish-trap.

In addition to causing an electric field by applying a potential to preferably metallic electrodes, there is also the possibility of generating the electric field in another manner, for example pyroelectric or piezoelectric effects are also suitable for field generation. A further preferred embodiment is shown in FIG. 8. In this, so-called electrets 6 are used (these are dielectrics with high permanent electric dipole moments) to generate the field. Many ferroelectric materials can be considered as electrets. For example, ceramic materials made from barium titanate can be polarised by cooling from temperatures above their Curie point in an electric field. Certain resins, waxes, polyurethane, polyethylene and fluorocarbons which are melted in a strong electric field retain the orientation of their dipoles caused thereby when the field is switched off after hard-setting.

The electret 6 is in each case protected by a polymer layer 1 from discharging through the liquid. This polymer layer forms, at the same time, the dielectric exposed to the solution and is advantageously also the carrier of active functional groups, which act as centres for formation of nuclei or crystallisation.

An electric field which is provided with a field component perpendicular to the surface of the dielectric is particularly advantageous.

The invention further relates to a method for controlling the formation of nuclei or epitaxial growth of crystals from a solution on the surface of a dielectric. With the method according to the invention it is provided that a regulatable electric field is applied to the dielectric in the area of its surface. By means of this measure non-polarised molecules can be polarised in the electric field or already polarised molecules can be orientated in the electric field. In particular, it is possible to orientate functional groups on the surface of the dielectric away from said surface and towards the solution in a controlled and specific manner, and thereby to influence activity with respect to formation of nuclei or crystallisation.

The invention allows numerous technical applications, just a few of which are set out hereafter:

Formation of crystal nuclei (seed crystals) by means of which precipitation and flocculation reactions can be controlled, in particular with respect to physical water treatment (by means of concentration, form, structure and size of the nuclei), growth of crystals/crystal nuclei with a specific form, size, structure and crystallographic orientation, reversal of the effect of nucleus formation—by means of appropriate adjustment of the electric double layer, surfaces can be produced on which no deposits form from the solution—special tubes for special industrial use (industrial waste water, sewage, pipelines).

What is claimed is:

1. Device for specific formation of nuclei or crystals on the surface of a dielectric in contact with a solution with an apparatus for generating an electric field in the dielectric which comprises an electrically conductive electrode arranged in the dielectric and an electrically conductive electrode with a different polarity, wherein the electric field in the dielectric includes the surface facing towards the solution, characterised in that the electrode with different polarity is arranged in or on the dielectric, wherein no solution is located between the electrode and the associated electrode with different polarity.

2. Device according to claim 1, characterised in that the electric field generated by the apparatus can be regulated using a control means wherein the size of the electric field in the area of the surface of the dielectric can be regulated.

3. Device according to claim 1, characterised in that the electric field is a continuous field, wherein the magnitude or the direction of the field can be controlled.

4. Device according to claim 1, characterised in that the electric field is alternating field, wherein the magnitude or direction of the field can be controlled.

5. Device according to claim 1, characterised in that polymers, crystals, ceramics, metal oxides or glasses are used as dielectrics.

6. Device according to claim 1, characterised in that a dielectric base material has, at least in the surface area, functional groups such as, for example, carboxylate groups, carbonyl groups or amino groups.

7. Device according to claim 6, characterised in that the functional groups are embedded into a polymer matrix by the selection of suitable monomers.

8. Device according to claim 1, characterised in that the surface of the dielectric is curved.

9. Device according to claim 1, characterised in that the surface of the dielectric forms the internal surface of a tube.

10. Device according to claim 1, characterised in that the surface of the dielectric is substantially planar.

11. Device according to claim 1, characterised in that the surface of the dielectric is shaped like a fish trap.

12. Device according to claim 1, characterised in that one electrode is a perforated electrode, wherein the electric field passes through the holes on the perforated electroce and includes the surface of the dielectric.

13. Device according to claim 2, characterised in that in the dielectric substantially planar perforated electrodes are arranged on both sides of a central, substantially planar electrode.

14. Device according to claim 1, characterised in that the electrodes are at least partially cylindrically curved.

15. Device according to claim 1, characterised in that metal electrodes, metal meshes, metal foils, electrically conductive plastics or graphite are used as electrodes.

16. Device according to claim 1, characterised in that the electrodes are at least partially cast in a hard setting dielectric.

17. Device according to claim 1, characterised in that the electrodes are at least partially vapour deposited as conductive layers or are applied as a conductivity lacquer or amalgam layers.

18. Device according to claim 1, characterised in that the electrodes are at least partly produced as electrolyte.

19. Device according to claim 1, characterised in that the electric field is formed by at least one electret.

20. Device according to claim 19, characterised in that the electret is surrounded by a layer supporting a preferably active functional group in, particular a polymer layer.

21. Device according to claim 1, characterised in that the electric field is generated by a pyroelectric or a piezoelectric effect.

22. Device according to claim 1, characterised in that the dielectric or the electrodes generating the electric field are generated by means of planar epitaxy.

23. Device according to claim 1, characterised in that the potential of the solution is applied to a higher, lower or equal potential defined by comparison with the field generating electrodes.

24. Device according to claim 1, characterised by means for expanding or compressing the dielectric.

25. Device according to claim 1, characterised by means for removing the nuclei or crystals formed on the dielectric.

26. Device according to claim 25, characterised in that the means include a control means for switching off or reversing the poles of the electric field.

27. Device according to claim 25, characterised in that the means include an ultrasound source.

28. Device according to claim 25, characterised in that the means cause the solution to flow along the surface of the dielectric.

29. Device according to claim 1, characterised in that the electric field is provided with a field component perpendicular to the surface of the dielectric in contact with the solution.

30. Method for controlling the seed formation and epitaxial growth of crystals from a solution on a surface of a dielectric, in particular on the functional groups of a polymer, wherein the dielectric is exposed, at least in the area of its surface, to an adjustable electrical field, characterized in that two electrodes of different polarity are arranged in the dielectric such that no solution is located between them.

31. Method according to claim 30, characterized in that when it has no field, the dielectric has non-polarized molecules which are polarized in the electric field.

32. Method according to claim 30, characterized in that when it has no field, the dielectric already has polar molecules which are oriented in the electric field.

33. Method according to claim 30, characterized in that functional groups on the surface of the dielectric are oriented away from it towards the solution.

34. Method for manufacturing a device according to claim 37, characterized in that during manufacture an electric field is applied to the dielectric during a hardening or solidifying process.

35. Method according to claim 34, characterized in that conductive electrodes can be embedded into the dielectric during manufacture, preferably cast inside it.

36. Method according to claim 35, characterized in that also during manufacture an electric field is applied by each electrode by means of which an electric field can be generated in the dielectric during subsequent operation.

* * * * *